United States Patent [19]

Kendrick et al.

[11] Patent Number: 5,042,257

[45] Date of Patent: Aug. 27, 1991

[54] DOUBLE EXTRUDED HEAT SINK

[76] Inventors: Julia S. Kendrick, 5928 Northwest Dr. #101, Mesquite, Tex. 75150; Edward J. Burke, 1700 Hearthstone, Plano, Tex. 75087

[21] Appl. No.: 345,727

[22] Filed: May 1, 1989

[51] Int. Cl.⁵ ............................................. F25B 21/00
[52] U.S. Cl. ........................................ 62/3.1; 62/3.7; 136/203
[58] Field of Search ................... 62/3.1, 3.7; 136/203, 136/204

[56] References Cited

U.S. PATENT DOCUMENTS 4,489,742 12/1984 Moore et al. ................ 136/203
4,730,459 3/1988 Schlicklin et al. ............ 62/3.7

FOREIGN PATENT DOCUMENTS 2408801 6/1979 France ................................ 62/3.2
233967 12/1968 U.S.S.R. ............................ 62/3.7

Primary Examiner—Lloyd L. King

[57] ABSTRACT

A double extruded heat sink for a thermoelectric cooler is disclosed which includes first and second finned plates. The first (base) plate has spaced long fins and pairs of spaced short fins spaced between adjacent long fins. The end fins have male members formed thereon. The second plate has spaced long fins. Each long fin corresponding with the space between the pair of spaced short fins of the first plate for engaging the inner surfaces of the spaced short fins and making good thermal contact therewith when the first and second plates are press fitted together. The end fins of the second plate's fins have female members formed thereon for engaging the male members to lock the first and second plates together when press fitted. The long fins of the first and second plates are serrated to increase their heat dissipating areas. The double extruded heat sink thereby provides a number of fins substantially greater than can be obtained using single extrusion techniques.

9 Claims, 1 Drawing Sheet

DOUBLE EXTRUDED HEAT SINK

This invention relates to thermoelectric coolers and more particularly to an improved heat sink therefor.

BACKGROUND OF THE INVENTION

Thermoelectric coolers are often referred to as TEC's or Peltier devices. These devices are actually heat pumps which operate on physical principles established over a century ago by Peltier.

In a TEC, semiconductor materials with dissimilar characteristics are connected electrically in series and thermally in parallel, so that two junctions are created. The semiconductor materials are N and P-type, and are so named because either they have more electrons than necessary to complete a perfect molecular lattice structure (N-type) or not enough electrons to complete a lattice structure (P-type). The extra electrons in the N-type material and the holes left in the P-type material are called "carriers" and they are the agents that move the heat energy from the cold to the hot junction.

Heat absorbed at the cold junction is pumped to the hot junction at a rate proportional to carrier current passing through the circuit and the number of couples.

In a typical TEC, alternatively columns of these N-type and P-type semiconductor materials have their ends connected in a serpentine fashion by electrical conductors. These electrical conductors typically are metallizations formed on insulating (ceramic) plates.

With the application of dc to the TEC, heat is absorbed on the cold side ceramic, passes through the semiconductor material, and is dissipated at the hot side ceramic.

A heat sink must be attached to the hot side ceramic for dissipating the heat from the TEC to the surrounding environment. Without a heat sink, the TEC would overheat and fail within seconds.

Thus, the efficiency of a TEC is a function of the material properties of the semiconductor modules and their operating junction temperatures. The electrical losses and the efficiency of the heat sink are all variables tha effectively control the cost and economic feasibility of a TEC.

Accordingly, this invention is concerned with the heat sink.

In the past, heat sinks have been manufactured using an extrusion process to form a plate having fins extending from one surface of the plate. The problem with the extrusion method is the limited number of fins which can be extruded, due to the limitations of the process. The limited number of fins on the plate thus reduces the cooling area available. The result is a decrease in the efficiency of the heat sink.

In an effort to increase the efficiency of the heat sink, fin retaining posts have been extruded from the front surface of a plate and fins are inserted between the posts. A grease joint is provided between the fins and the plate to increase thermal exchange between the two elements. The fins are secured in thermal contact with the plate by a rod inserted between the retaining posts and the fins. Those persons desiring more information concerning the details of this structure are referred to U.S. Pat. No. 4,734,139, issued Mar. 29, 1988.

Disadvantages of the above described heat sink structure lie in the complexity of the device which increases its manufacturing cost, and the cost of assembly attending the formation of the grease joints and the placement of the fin retaining rods.

SUMMARY OF THE INVENTION

Accordingly, it is an object of this invention to provide a heat sink having increased operating efficiency.

Another object of the invention is to provide a low cost heat sink which is relatively easy to manufacture using mass production techniques.

Briefly stated, the heat sink of this invention is a double extruded heat sink formed by two separate extruded finned plates which are press fitted together to double the number of fins in the heat sink.

BRIEF DESCRIPTION OF THE DRAWINGS

Other objects and features of the invention will become more readily apparent from the following detailed description when read in conjunction with the accompanying drawings, in which.

DETAILED DESCRIPTION OF THE INVENTION

Figure 1:
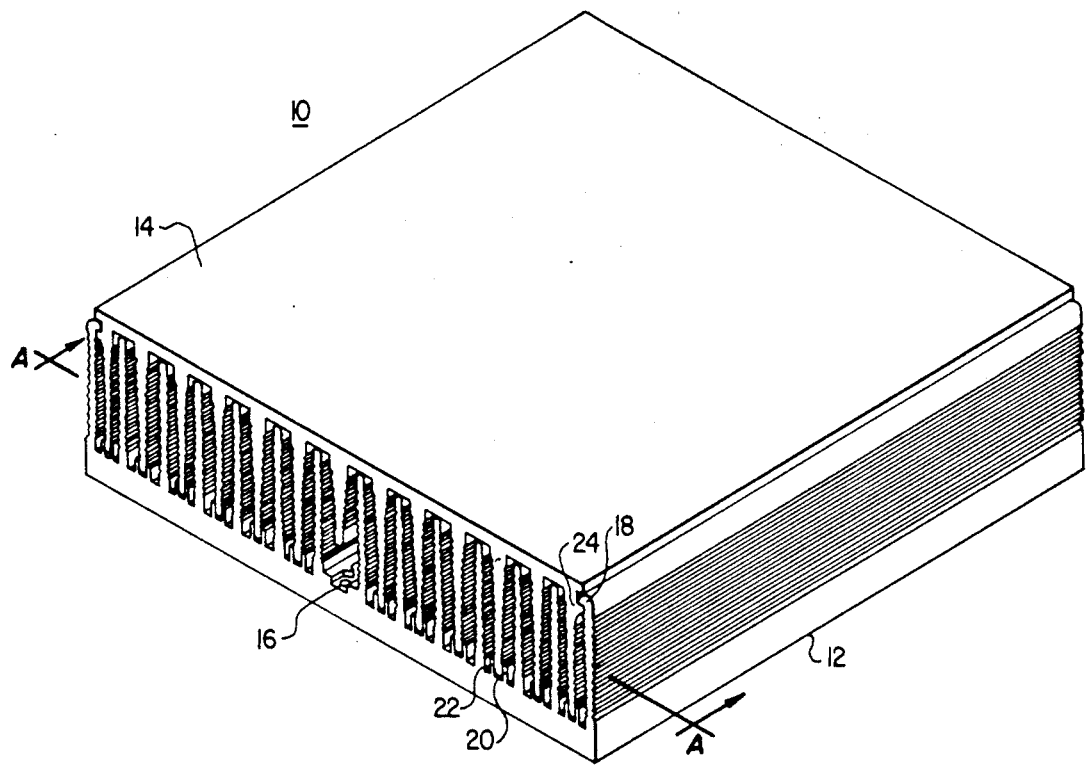
FIG. 1 is an isometric view of the heat sink of the present invention.

Referring to FIG. 1, the heat sink of the present invention includes opposing finned plates 12 and 14 press fitted and locked together as hereinafter described. Plate 12 has apertures 16 adjacent to each end and centered between the sides. The apertures are coined to receive hex nuts. Thus, two heat sinks may be joined together, with a thermoelectric cooler between them. Plate 14 provides a flat surface either for attachment to a shroud (not shown) or mounted within a correspondingly shaped aperture in the shroud. The edges of finned plates 12 and 14 have press-fit "keys" or guides formed thereon for facilitating press fitting the finned plates together to form the heat sink. This form of attachment ensures that the finned plates 12 and 14 are intimately attached and will remain so for the life of the heat exchanger.

Plate 12 has a plurality of fins 18, 20 and 22; the plate 14 has a plurality of fins 24. The fins 18 and 22 have serrated surfaces for providing increased surface area for enhancing their thermal performance to increase their operating efficiency. The fins 18, 20, 22, and 24 extend longitudinally between the ends of plates 12 and 14 and parallel to their sides in a spaced relationship to form passages for air there between. Air is typically forced or drawn through the passages by an electric fan mounted within the shroud.

Figure 2:
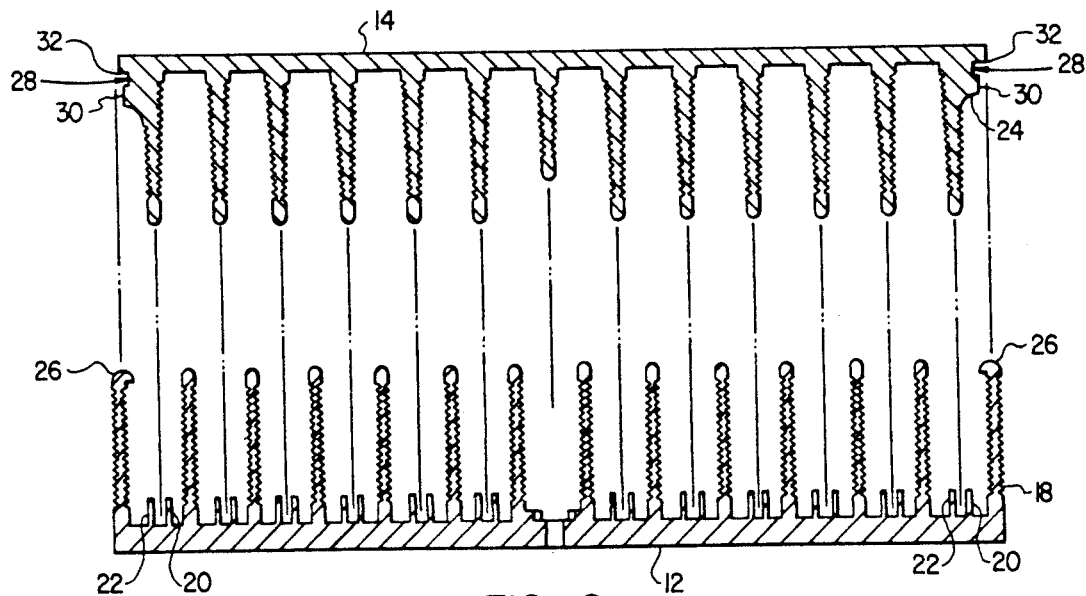
FIG. 2 is a cross sectional view of the heat sink taken along line A—A of FIG. 1 and exploded to show the details of the two separate extruded finned plates.

Referring now to FIG. 2, the fins 18 of plate 12 are spaced one from another by the fins 20 and 22. The fins 20 and 22 are spaced from the fins 18 adjacent thereto and are spaced one from the other a distance sufficient to receive end portions of the fins 24 of plate 14. So arranged the fins provide air passages for the circulation of air across the fins. The fins 18 have a heighth substantially greater than that of the fins 20 and 22. The heighth ratio between the fins 18 and fins 20 and 22 is about 14 to 1. The heighth of the shorter fins 20 and 22 is sufficient to provide thermal surface area contacts with end portions of fins 24 when the fins 24 are press fitted therebetween to provide efficient exchange of heat.

The end fins 18 have male members 26 adjacent to their ends opposite the ends on the plate 12. The male members extend inwardly of the fins 18.

The fins 24 are extruded on a surface of the plate 14 in a spaced relationship one to another such as to be directly opposite the space between the fins 20 and 22 of plate 12 when the two plate are press fitted together. The heights of the fins 24 are substantially equal to the heights of fins 18 on plate 12 and the thickness of the end portions thereof opposite their ends on the plate 14 are sufficient for press fitting between the fins 20 and 22. The end fins 24 are providing with female members 28 formed on the outer surfaces thereof. The female members have ramp to plateform portions 30 leading to grooves 32. The ramp to platform portions are sufficiently long and wide to engage the male members of the fins 18 and spring them outwardly for entry and frictional retention in the grooves. The groove edges are formed adjacent to the end of the ramp and the plate 14.

To accommodate the connector apertures 16, the fins 20 and 22 are omitted between the adjacent fins 18, and the corresponding fin 24 is made shorter than its adjacent fins 24.

The following described heat sink example is typical of the heat sinks of the present invention. For example, the plates 12 and 14 are 5×5 inch aluminum plates having a thickness of about 0.200 and 0.100 inch, respectively. The apertures 16 have a bore diameter of 0.147 inch and coined to receive a number 4 hex nut.

The centers of the bores of plate 12 are 0.175 inches and 2.5 inches from the ends and sides of plates 12, respectively. The plate 12 has fourteen fins 18 having a thickness of 0.088 inches, heights of 0.910 inches and spacings of 0.421 inch between the end fins and their adjacent fins 18 and spacing of 0.378 inch between the remaining fins 18. The spacings are measured center to center of fins 18. The exterior surfaces of the end fins may or may not be serrated, but the interior surfaces of the end fins and the fins 18 intermediate the end fins 18 have 90 degree by 0.020 deep serrations. The male members extend 0.030 inches inwardly of the inner surface of the exterior fins 18, and have a width of 0.055 inches.

The plate 12 has twenty-four fins—twelve each of fins 20 and 22. The fins 20 and 22 have 0.065 inch heights, and 0.045 inch thicknesses. The fins 20 and 22 have 0.067 inch spaces between their outer edges and edges of adjacent fins 18, and are spaced 0.076 inches measured edge to edge one from the other.

The plate 14 has thirteen fins 24. The thirteen fins include six fins on each side of a central fin. The central fin has a heighth of 0.610 inches; while, the remaining twelve fins have heights of 0.910 inches, base thicknesses of 0.078 inches, and upwardly and inwardly extending tapers of two degrees to end thicknesses of 0.064 inches. The space between edges of adjacent fins at the base is 0.300. The fins 24 have 90 degree by 0.020 deep surface serrations. The female members 28 of the exterior fins 24 have grooves 32 having edges 0.193 and 0.103 inches long as measured from the ends of the face plate 14 and bases of the exterior fins 24, respectively. The 0.103 inch edge terminates at a 0.035 vertical ledge 30. The interior radius of the groove is 0.030 inches.

In operation the press-fit "keys" guarantee an easy, reliable fit between the two finned plates when pressed together until locked. When locked together the fins 24 of the top plate 14 fit snugly between the smaller fins of the base plate 12. The smaller fins provide good thermal contact between the two finned plates, while the increased number of fins with serrated edges increase the thermal performance of the heat sink.

Another only a single embodiment of the invention has been described, it will be apparent to a person skilled in the art that various modifications to the details of construction shown and described may be made without departing from the scope of this invention.

What is claimed is:

1. A heat sink for a thermoelectric cooler or the like comprising:

a first plate means;

first and second pluarlities of spaced fins formed on a surface of the first plate means;

a second plate means; and a pluarality of spaced fins formed on the second plate means, said fins of the plurality of spaced fins corresponding to the spaces between pairs of the second plurality of spaced fins on the first plate;

said first and second plates means being fitted together with the plurality of second fins of the first plate means having surfaces being joined together through end portions of the plurality of fins of the second plate for providing good thermal contact between the second plurality of spaced opposing fins of the first plate and the corresponding fins of the second plate thereby providing fins for the first plate in addition to the first plurality of fins of the first plate; and wherein the first and second pluarality of spaced fins of the first plate means are extruded fins, and the plurality of spaced fins of the second plate means are extruded fins.

2. A heat sink according to claim 1 wherein the first plurality of spaced fins of the first plate means have a length substantially longer than the second plurality of spaced fins of the first plate, and the spaced fins of the second plate means have a length substantially equal to the length of the first plurality of spaced fins of the first plate for joining the plurality of spaced fins of the second plate means to the second plurality of spaced fins of the first plate whereby the plurality of spaced fins of the second plate means are thermally joined to the first plate means and coact with the plurality of spaced fins of the first plate to form an extruded heat sink having a substantially increased number of fins.

3. A heat sink according to claim 1 wherein the fins of the first plurality of fins of the first plate means are interspersed between pairs of the fins of the second plurality of fins of the first plate means and said end forming fins of the firstg plurality of fins include a first part of a locking means, and the end forming fins of the second plate means include a second part of a locking means, said first and second parts of the locking means being operable to lock the first and second plate means together when the first and second plate means are pressure fitted together.

4. A heat sink according to claim 3 wherein the first and second plate means includes positioning guides for facilitating the pressure fitting of the plurality of fins of the second plate means between pairs of the second plurality of fins of the first plate means.

5. A heat sink according to claim 1 wherein the first plate means includes attachment means for attaching the heat sink to a device for dissipating heat generated by the device during opeation of the device.

6. A heat sink according to claim 1 wherein the first plurality of fins of the first plate means and the second plurality of fins of the second plate means are elongated fins having serrated surfaces for increasing their surface areas.

7. A heat sink for a thermoelectric cooler or the like comprising:
- a first plate means having a first surface for connection to a device generating heat requiring dissipation during operation of the device, and a second surface, first and second pluralities of fins extruded from the second surface, said first plurality of fins having lengths substantially longer than those of the second plurality of fins and being spaced apart sufficiently to accommodate pairs of the spaced fins of the second plurality of fins there between and providing spaces between inner surfaces of adjacent ones of the first plurality of fins and outer surfaces of the adjacent pairst of spaced fins of the second plurality of fins, a first part of a locking means formed on the ends of the fins adjacent side edges of the first plate; and
- a second plate means having a first surface, a plurality of fins extruded from the second plate means and having a location corresponding to the space between the pairs of the spaced fins of the second plurality of fins of the first plate means, said fins having a length substantially equal to the length of the first plurality of fins of the first plate means and end portions adapted for pressure fitting between the pairs of second plurality of fins of the first plate means for providing good thermal contact there between, a second part of a locking means formed on the outer surfaces of the end fins of the second plate means adjacent to the second plate means for receiving the first part of the locking means of the first plate means for locking together the first and second plate means when pressed together.

8. A heat sink for a thermoelectric cooler or the like according to claim 7 wherein the the first plate means further includes connecting means for connecting the first heat sink to a second heat sink with a thermoelectric cooler sandwiched there between.

9. A heat sink for a thermoelectric cooler or the like comprising:
- a first plate means;
- first and second pluralities of spaced fins formed on a surface of the first plate means, said second plurality of spaced fins including pairs of laterally disposed opposing fins;
- a second plate means; and
- a plurality of spaced fins formed on the seond plate means, said fins of the plurality of spaced fins having end portions corresponding to the spaces between the pairs of opposing fins of the second plurality of spaced fins of the first plate means;
- said first and second plate means being fitted together with the plurality of opposing fins of the second fins of the first plate means having surfaces being joined together through end portions of the plurality of fins of the second plate means for providing good thermal contact between the second plurality of spaced opposing fins of the first plate means and the corresponding fins of the second plate means whereby the second plurality of spaced fins of the first plate means coact with the plurality of spaced fins of the second plate means to increase substantially the number of fins for the heat sink.

* * * * *